United States Patent [19]
Usuda

[11] 3,821,779
[45] June 28, 1974

[54] SEMICONDUCTOR DEVICE WITH HIGH CONDUCTIVITY AND HIGH RESISTIVITY COLLECTOR PORTIONS TO PREVENT SURFACE INVERSION

[75] Inventor: Koji Usuda, Tokyo, Japan

[73] Assignee: Hitachi, Ltd., Tokyo, Japan

[22] Filed: Aug. 28, 1969

[21] Appl. No.: 853,848

Related U.S. Application Data

[63] Continuation-in-part of Ser. No. 685,098, Nov. 22, 1967, abandoned.

[30] Foreign Application Priority Data

Nov. 25, 1966 Japan .............................. 41-76900

[52] U.S. Cl. ..................... 357/34, 354/52, 354/89
[51] Int. Cl. .............................................. H01l 7/02
[58] Field of Search .................................... 317/235

[56] References Cited

UNITED STATES PATENTS 3,370,995 2/1968 Lowery et al. ...................... 317/235

FOREIGN PATENTS OR APPLICATIONS 269,418 3/1965 Australia ............................ 148/175

*Primary Examiner*—Jerry D. Craig
*Attorney, Agent, or Firm*—Craig and Antonelli

[57] ABSTRACT

A semiconductor device comprising a monocrystalline region of a P-type high resistivity, a heavily doped P-type substrate deposited from vapor phase and having a plane surface common with a plane surface of the monocrystalline region, an N-type region formed in the monocrystalline region by introducing a donor type impurity from the common surface into the monocrystalline region, and a heavily doped P-type thin layer formed between the monocrystalline region and the substrate by introducing an accepter impurity into the surface of the monocrystalline region facing the substrate before depositing the heavily doped substrate on the monocrystalline region, whereby a space charge layer which might spread from the PN junction between the monocrystalline region and the N-type region through the P-type monocrystalline region during operation of the device is prevented by the heavily doped P-type thin layer from reaching the heavily doped P-type substrate which includes crystallographical defects and is apt to break down in a low electric field because of the crystallographic defects, and also an inversion layer induced in the monocrystalline region of P-type high resistivity by an $SiO_2$ film covering the common plane surface is interrupted by the heavily doped P-type substrate.

6 Claims, 16 Drawing Figures

SEMICONDUCTOR DEVICE WITH HIGH CONDUCTIVITY AND HIGH RESISTIVITY COLLECTOR PORTIONS TO PREVENT SURFACE INVERSION

CROSS-REFERENCE TO RELATED APPLICATION

This is a continuation-in-part application of Ser. No. 685,098, entitled SEMICONDUCTOR DEVICE WITH HIGH CONDUCTIVITY AND HIGH RESISTIVITY COLLECTOR PORTIONS TO PREVENT SURFACE INVERSION, filed on Nov. 22, 1967 now abandoned.

BACKGROUND OF THE INVENTION

1. Field Of The Invention

This invention relates to a semiconductor device such as a transistor and a diode and the method of making the same.

2. Description Of The Prior Art

It is generally known that in a semiconductor element such as a planar type transistor, wherein a passivation film such as an oxide film is formed on the surface thereof, an N conductivity type space charge layer sometimes called a channel is induced in the surface of the semiconductor substrate below the film by the presence of the passivation film. For example, in a PNP silicon transistor, the surface potential of the surface part of a high resistivity P-type collector region covered with an oxide film is inverted into an N-type. This N-type channel layer imposes undesirable effects on the electrical characteristics of the element like an increase of leakage current, worsening of the breakdown voltage, etc.

In order to prevent the influence of said channel effect, a method to form an annular-shaped heavily doped region in the collector surface has already been proposed. This method will be explained with reference to FIG. 1.

In FIG. 1, the numerals 1 and 2 designate P-type and i-type collector regions, 3 and N-type base region, 4 a P-type emitter region and 6, 7 and 9 electrodes connected to the base, emitter and collector regions, respectively. In order to increase the brakdown voltage of the collector junction and reduce the collector saturation resistance, a substrate comprising a heavily doped impurity region 1 and a high resistivity region 2 formed thereon by an epitaxial growth method is generally employed. The high resistivity layer 2 usually has the same conductivity type as the heavily doped impurity region 1. Accordingly, in the example described herein the high resistivity layer 2 has a P-type conductivity. Reference numeral 5 indicates an oxide film, which covers the substrate surface and protects the element from the outer atmosphere. Further, due to the presence of said oxide film 5, an N-type channel layer 8 is induced in the surface of the region 2. The N-type channel 8, however, is intercepted by an interception layer 10, because this interception layer 10 has the same conductivity type as the collector region 2 and has a higher impurity concentration than the latter and is formed in an annular shape in a way to surround the base region 3. The channel layer 8, therefore, does not continuously extend to the semiconductor surface. Since the channel 8 is cut by said interception layer 10, leakage current running through the channel 8 is prevented and the collector breakdown voltage increases. However, the structure explained hereinabove suffers from the following defects.

1. The passivation layer 10 is usually formed simultaneously with the diffusion step for providing the P-type emitter layer 4. Accordingly, the oxide film on the interception layer 10 becomes thin. Accordingly, when the conducting layer 6 is formed on the oxide film 5, as shown in FIG. 1, the chance for a short-cricuit between the conducting layer 6 and the collector region through the pinholes possessed by the thin oxide film becomes large. Further, the coupling capacitance between the conducting layer and the collector region increases.

2. When it becomes necessary to realize a collector electrode from the upper surface of the substrate, the high resistivity layer 2 is placed between the collector electrode and the high conductivity layer 1 and thus the collector series resistance becomes large.

SUMMARY OF THE INVENTION

An object of this invention is to provide a semiconductor device having a novel structure, wherein the influence of the channelling phenomenon and a short-circuit between the conducting layer extending over the oxide film and the semiconductor region thereunder can be prevented.

Another object of the invention is to provide a transistor structure, wherein the collector series resistance can be reduced when all the electrodes are provided on one surface.

A further object of the invention is to provide a transistor structure which can be used with a higher operating voltage.

A semiconductor device according to one embodiment of this invention comprises a heavily doped epitaxially grown semiconductor region of a P conductivity type having a substantially uniform impurity distribution, a high resistivity monocrystalline semiconductor region formed in the surface of the heavily doped region, the heavily doped region and the high resistivity region providing a substantially plane common surface, at least one N conductivity type semiconductor region formed in high resistivity region, and a heavily doped P-type thin layer formed between heavily doped epitaxially grown semiconductor region and said high resistivity region by introducing an accepter impurity into said surface of said monocrystalline semiconductor region facing said epitaxially grown region before depositing the epitaxially grown region.

Other objects and features of this invention will be obvious from the following explanations of the embodiments according to the invention in conjunction with the attached drawings.

BRIEF DESCRIPTION OF THE DRAWINGS

FIGS. 3*a* to 3*g* are sectional diagrams of a semiconductor wafer presented for the explanation of the method of making the semiconductor element shown in FIG. 2 in accordance with the order of the manufacturing processes.

DESCRIPTION OF THE PREFERRED EMBODIMENTS

Figure 1:
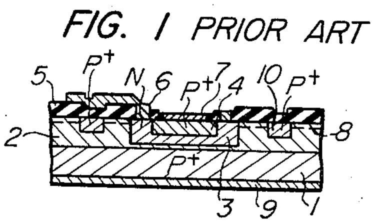
FIG. 1 PRIOR ART
FIG. 1 is a sectional diagram of a PNP transistor according to the prior art.
Figure 2:
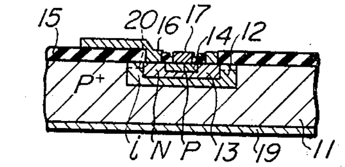
FIG. 2 is a sectional diagram of a semiconductor element according to an embodiment of this invention.
Figure 2:
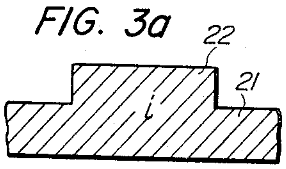

Now, an embodiment of this invention will be described hereinbelow with reference to FIG. 2. In the figure, a PNP transistor is shown as an example. Reference numeral 11 indicates a heavily doped P-type silicon substrate (it is also a collector region and will be called a P region hereafter) having a specific resistance of from 0.001 to 0.01Ω-cm, 12 a high resistivity region (called an i-type region hereafter) formed in the region 11 and having a specific resistance of about from 1 to 10Ω-cm, 13 an N-type base region formed in the i-type region 12 by a conventional selective diffusion method, 14 a P-type emitter region formed in said base region 13 by a selective diffusion method, 19, 16 and 17 electrodes connected to the $P^+$-type region, base and emitter regions and 15 and insulating film, for example, of $SiO_2$ which protects the substrate surface from the outer atmosphere, respectively. In such a structure, since the main part of the element is surrounded completely by the $P^+$-type region 11, a channel 20 induced in the surface of the i-type region 12 is intercepted by said $P^+$-type region 11. Therefore, the element is substantially immune from the influence of the channel 20. Now, an example of a method of making such a transistor will be described according to the order of the manufacturing steps in conjunction with FIGS. 3a to 3g.

Step *a*. A high resistivity silicon monocrystalline substrate (i-type substrate) 21 having a specific resistance of 1 to 10Ω-cm was prepared and the surfaces except the desired part of one principal surface thereof was eliminated by a conventional chemical etching process to form a convex part 22 of from 15 to 20$\mu$ in height as shown in the FIG. 3*a*. This silicon monocrystalline substrate should be substantially free from the crystallographical defects such as crystal dislocations and grain boundaries. Such a silicon crystal can be obtained by a conventional crystal pulling method.

Step *b*. A P-type impurity, boron, was diffused into the i-type substrate 21 from a surface thereof comprising the convex part 22 to form a heavily doped P-type region 23 having a thickness of about from 3 to 5$\mu$. The reason for providing the P-type diffused region 23 will be described below. The desirable impurity concentration of an epitaxially grown layer to be formed thereon is about $10^{19}$ atoms/cm$^3$ or more.

Step *c*. A heavily doped P-type epitaxial layer 24 was then grown on the surface of said P-type region 23. It is not always necessary that the epitaxial layer 24 be a monocrystal. The heavily doped P-type epitaxial layer 24 was grown by subjecting a gas including a dopant determining the P-type in the form of $BCl_3$ and a silicon halogen gas such as $SiCl_4$ to hydrogen reduction. It should be noted that the boundary between the P-type diffused region 23 and the P-type epitaxial layer 24 remains in the $P^+$-type collector region of the completed transistor.

Figure 6:
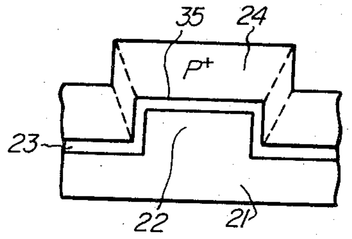
FIG. 6 is a sectional diagram explaining crystallographic defects developed in the epitaxially grown region.

Generally, crystallographical disorders are likely to be generated at the boundary between a substrate and an epitaxial layer grown thereon due to unevenness of the surface of the substrate and dusts adhered to the surface and, especially, in a case where a high convex part is present on the substrate surface as in this embodiment, the crystal feature of the epitaxial layer may sometimes be disturbed due to the convex part 22. Referring to FIG. 6, crystal disorders or crystal defects such as crystal dislocations, crystal grain boundaries or polycrystals are developed in the epitaxial layer 24 during the epitaxially deposited process as shown by the broken lines. An electric field is concentrated in such a part including the crystal disorders or defects and the part is apt to break down with a weak electric field when an electric field is applied to the epitaxially grown layer. The diffusion layer 23 is provided for preventing an electric field from reaching the part including the crystal disorders. That is, the depletion or space charge layer spreading through the i-type layer 21 stops at the diffused layer 23 and thus the concentration of a large electric field at the boundary part 35 can be prevented. However, where there is no fear of crystal disorders, or where the effect of the crystal disorders, if present, on the electrical characteristics is negligibly small, the diffused layer 23 is not necessary and can be dispensed with according to the purpose.

Step *d*. A part of the i-type substrate 21 was eliminated by a chemical etching process or a lapping process to expose the $P^+$-type epitaxial layer 24. The convex portion of the epitaxial layer 24 was also removed to flatten the surface of the epitaxial layer 24. What counts in this treatment is to eliminate the i-type substrate 21 until a part of the $P^+$-type epitaxial layer 24 becomes exposed and thereby to expose the heavily doped $P^+$-type region on both principal surfaces of the wafer as shown in the FIG. 3d. Accordingly, at one of the smooth surfaces, the surface of the exposed high resistivity region 21 becomes completely surrounded with the surface of the $P^+$-type epitaxial region 24.

Step *e*. A silicon oxide film 26 of 5,000A in thickness was formed on the principal surface of the wafer to which the high resistivity region 22 is exposed. Then, a hole was provided in the silicon oxide film 26 by selectively eliminating the desired part thereof with an etchant including HF and, by diffusing a donor impurity in an oxidizing atmosphere through the hole, an N-type base region 27 having an impurity concentration of about $10^{18}$ atoms/cm$^3$ was formed in the i-type region 22. During the step of diffusing the impurity a new silicon oxide film 28 of about 3,000A in thickness was formed on the base region 27. In this case, the thickness of the i-type layer is determined by this donor impurity doping step and a value greater than the maximum extension of the depletion or space charge layer in normal operating of the element is desirable for the thickness of the i-type layer, for example, 10$\mu$.

Step *f*. an acceptor impurity, for example, boron was selectively diffused through a hole formed in the newly formed oxide layer 28 into the base region 27 to form a P-type emitter region 29 having an impurity concentration of about $10^{20}$ atoms/cm$^3$. An $SiO_2$ film 30 of about 2,000A in thickness was again thermally produced on the emitter region.

Figure 3B:
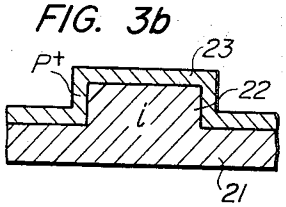
Figure 3C:
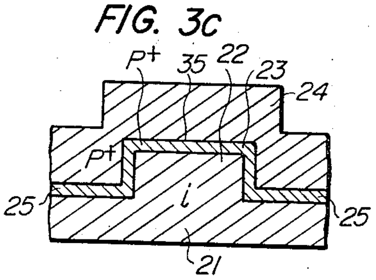
Figure 3D:
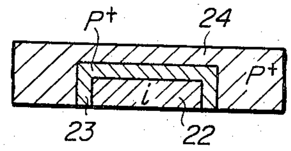
Figure 3E:
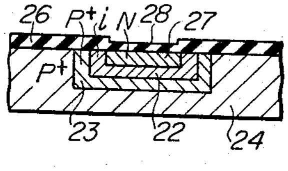
Figure 3F:
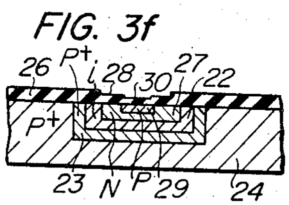
Figure 3G:
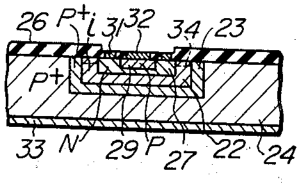

Step *g*. Electrodes, for example, of aluminum, 33, 31 and 32 were set to the $P^+$-type collector region 24, the N-type base region 27 and the P-type emitter region 29, respectively. Thus, a transistor element having a PNiP structure as shown in FIG. 2 or 3*g* is constructed.

In a transistor provided according to the manufacturing process as described hereinabove, since the operating regions of the transistor like the base region 27, the emitter region 29 etc. are surrounded with the $P^+$-type collector regions 23 and 24, the channel generated on the surface of the i-type collector region is quenched by the $P^+$-type collector regions. That is, although a channel layer 34 is intercepted by the $P^+$-type collector regions 23 and 24, this transistor is no longer substantially influenced by the channel. Further, since the oxide film can be made relatively thick and uniform, the danger of a short-circuit between the conducting layer and the substrate through the pinholes due to the thinness of the oxide film can be reduced.

Through a case where an i-type substrate is used as a starting material is described in the embodiment, a semiconductor substrate having a certain conductivity type and a relatively high specific resistance, for example, $P^-$- or $N^-$- type silicon substrate, can be used as well.

The function of the heavily doped diffused region 23 will be explained in detail here referring to FIGS. 7*a* and 7*b*. In FIG. 7*b*, the portion designated by the numeral 71 shows the impurity concentration in the epitaxial layer 24 shown in FIG. 3*g*. The numeral 72 indicates the distribution state of the impurity concentrations in the diffused $P^+$-type region 23, and the numeral 73 that in the i-type region 22. The broken line designated by the numeral 77 shows a distribution state of an electric potential in a space charge region or a depletion region spread from the PN junction between the N-type region 27 and the i-type region 22 during operation of the transistor. The strength of the electric field is indicated by the slope of the broken line 77. It will be understood from the figure that the electric field spread from the PN junction stops as shown by the broken line 77 in the diffused region 22 which was formed by diffusing an impurity into the i-type monocrystalline region and, therefore, was substantially free from crystallographical defects. That is, the electric field is prevented by the $P^+$-type diffused region 23 from reaching the epitaxial layer 24 which is apt to break down electrically with a weak electric field. The broken line designated by the numeral 74 shows the interface between the epitaxial layer 24 and the diffused region 23.

Figure 7A:
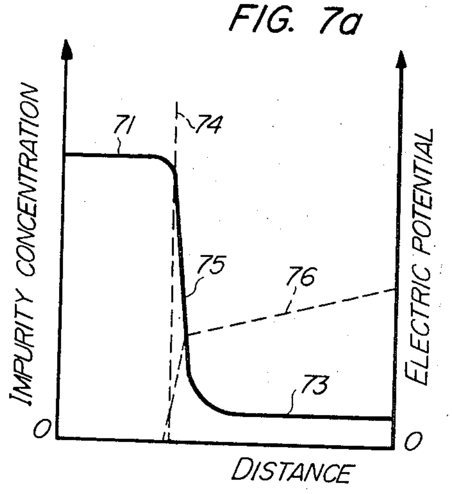
FIGS. 7a and 7b show distribution states of impurity concentration and electric fields in the semiconductor bodies.
Figure 7B:
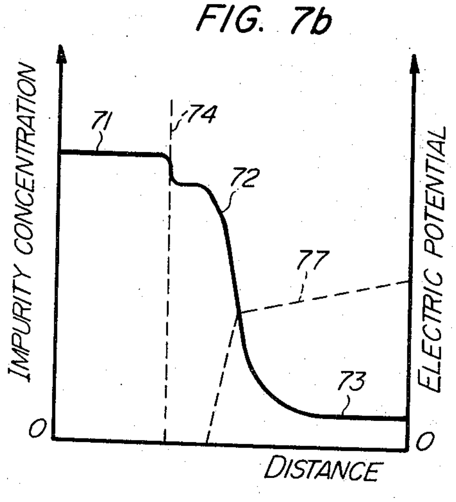

In contrast, in FIG. 7*a*, the broken line designated by 76 shows a distribution state of an electric potential in a semiconductor structure which does not have the heavily doped $P^+$-type region 23 shown in FIG. 3g. The electric field spreads as shown by the broken line 76 through the interface 74 into the epitaxial layer 24 which includes many crystallographical defects. Reaching of the electric field in the epitaxial layer 24 sometimes results in the electrical breakdown of the transistor with a low operating voltage. By heat treatment during manufacturing the transistor, the impurity included in the heavily doped epitaxial region 24 may diffuse into the i-type monocrystalline region 22 as shown by the sloped line 75. The impurity concentration and the thickness of the diffused region formed during the heat treatment is not enough to stop the electric field in the monocrystalline region which is substantially free from the crystallographical defects. Therefore, where there is a fear that an electric field comes close to the interface 74, a heavily doped diffused region 23 should be formed before forming the epitaxial region 24.

Now, a semiconductor device according to a further embodiment of the invention will be described hereinbelow.

Figure 4:
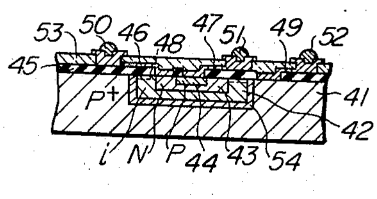
FIG. 4 is a sectional diagram of a semiconductor element according to another embodiment of the invention.

This invention can also be applied to a face bonding element as shown in FIG. 4. The same figure shows, in particular, a case where the invention is applied to a face bonding chip-type transistor wherein all the electrodes of the semiconductor device are set on one surface. In the figure, the numeral 53 indicates a glass layer comprising silicon oxide and an oxide of phosphourus, boron or the like formed on an oxide film 45 covering a $P^+$-type collector region 41, an N-type base region 43 and a P-type emitter region 44. The electrodes attached to the regions have a structure wherein ball shaped metals 52, 50 and 51 having a low melting point, for example, gold or solder, are set to the metal electrode layers 49, 46 and 47, extending over the surface of the oxide film 45 from said respective regions to the surface of the glass layer 53. The regions designated by the numerals 41, 54, 42, 43 and 44 in the FIG. 4 correspond to the regions 24, 23, 22, 27 and 29 shown in FIG. 3*g* and were prepared by the same steps as shown in FIGS. 3*a* to 3*g*. In such a structure, the influence of the channel effect can be prevented as in a transistor shown in FIG. 2. Further, since the collector electrode 49 is connected to the heavily doped collector region 41, the collector series resistance can be reduced remarkably. Still further, an electric field spread from the base-collector junction is stopped at the heavily doped $P^+$-type region 54. A transistor which can be operated at a high operation voltage is obtained thereby.

As has been fully described hereinabove, what is particularly important in this invention is the requirement that the substrate below the oxide film has a high impurity concentration sufficient to prevent the influence of the channel and in this embodiment, it is desirable to make the specific resistance of the substrate about 0.01Ω-cm or less. Accordingly, in the manufacturing process of a semiconductor device according to this invention, in particular when eliminating the i-type substrate 21 in FIG. 3*d*, it is required to eliminate the i-type substrate 21 until the $P^+$-type epitaxial layer 24 having a specific resistance of less than 0.01Ω-cm is completely exposed if the specific resistance of the $P^+$-type diffused layer 23 is more than 0.01Ω-cm. The reason is that it is difficult to quench the channel completely only with the diffused layer if the diffused layer having a specific resistance of more than 0.01Ω-cm remains.

Figure 5A:
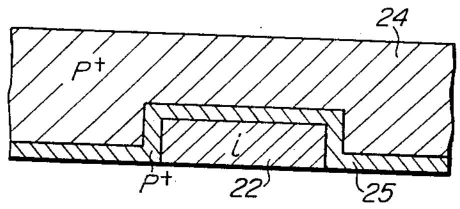
FIGS. 5a to 5c are sectional diagrams of a semiconductor wafer for the explanation of a further embodiment of the invention.
Figure 5B:
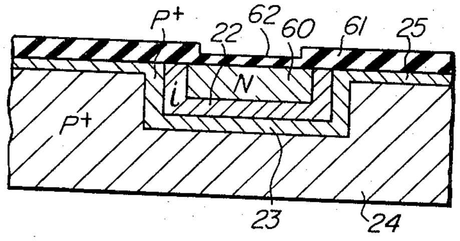
Figure 5C:
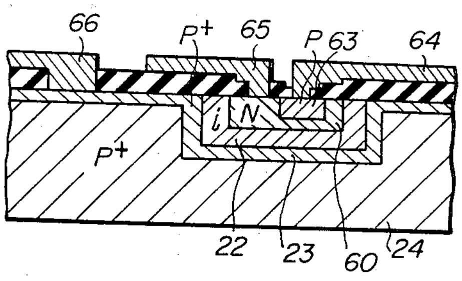

However, when the diffused layer has an impurity concentration sufficient to quench the channel, the following method can be employed. FIGS. 5*a*, 5*b* and 5*c* are sectional diagrams of a semiconductor wafer for the explanation of the manufacturing process according to a further embodiment of this invention. FIG. 5*a* is a fragmentary sectional diagram of a wafer provided by quitting the treatment of the elimination of the i-type layer at the $P^+$-type diffused layer 23, the treatment following the process shown in FIG. 3*c*. In FIG. 5*a*, the numeral 24 indicates a low resistivity region whose properties depend on the starting material and the numeral 25 designates the exposed surface part of the $P^+$-type diffused layer 23. Then, as shown in FIG. 5*b*, a silicon oxide film 61 having a thickness of several thousand angstroms was thermally produced on the surface of the i-type layer 22 and the $P^+$-type layer 25 and subsequently a donor impurity was selectively introduced into the i-type layer 22 through a hole formed in the oxide film to form an N-type base region 60. At this time, a further oxide film 62 was formed on the surface of the N-type diffused layer 60. Finally, as shown in FIG. 5*c*, a hole was provided in the oxide film after forming a P-type diffused emitter region 63, and a collector electrode 66 to be connected to the $P^+$-type layer 23, a base electrode 65 to be connected to the N-type base region 60 and an emitter electrode 64 to be connected to the P-type emitter region 63 were formed by the combination of vacuum evaporation and photo-etching.

I claim:

1. A semiconductor device comprising:

a high resistivity monocrystalline semiconductor region of a first conductivity type extending to a plane surface, the concentration of the impurity determining the first conductivity type being distributed substantially uniformly;

a heavily doped thin diffused region of said first conductivity type formed in and underlying said monocrystalline semiconductor region and extending to said plane surface, the exposed surface of said high resistivity region being surrounded completely with said heavily doped thin region at said plane surface;

a diffused region of a second conductivity type opposite to said first conductivity type formed in said plane surface of said high resistivity region, the diffused region of the second conductivity type being spaced apart from said heavily doped thin region and defining with said high resistivity region a PN junction extending to said plane surface, the exposed surface of said diffused region being surrounded completely with said high resistivity region at said plane surface; and a heavily doped epitaxial semiconductor substrate of said first conductivity type epitaxially formed in contact with and underlying said heavily doped thin diffused region and having a common plane surface with said plane surface of said high resistivity region, the exposed surface of said heavily doped thin diffused region being completely surrounded with said heavily doped epitaxial substrate at said common plane surface, said epitaxial semiconductor substrate including crystallographical defects at least in the portion immediately adjacent to the interface between said heavily doped thin diffused region and the epitaxial semiconductor substrate, the portion including crystallographical defects being separated from said high resistivity monocrystalline semiconductor region by said heavily doped thin diffused region.

2. A semiconductor device according to claim 1, wherein said PN junction is spaced apart from said heavily doped thin region by a distance of at least 10 microns.

3. The semiconductor device of claim 1, wherein the specific resistance of the heavily doped semiconductor region of said first conductivity type is no more than about 0.01Ω-cm.

4. The semiconductor device of claim 1, wherein the specific resistance of the heavily doped semiconductor region of said first conductivity type is about 0.001 to 0.01Ω-cm.

5. The semiconductor device of claim 1, wherein the specific resistance of the high resistivity semiconductor region of said first conductivity type is about 1 to 10 Ω-cm.

6. A semiconductor device comprising a high resistivity monocrystalline semiconductor region of a first conductivity type extending to a plane surface and being substantially free from crystallographical defects;

a diffused region of a second conductivity type opposite to said first conductivity type formed in said plane surface of said high resistivity region and defining with said high resistivity region a PN junction extending to said plane surface;

a heavily doped thin region of said first conductivity type underlying said monocrystalline semiconductor region and extending to said plane surface, the heavily doped thin region being formed by introducing an impurity determing the first conductivity type into the monocrystalline semiconductor region to such a thickness and with such an impurity concentration that a space charge layer spreading from said PN junction during normal operation of the device stops in the heavily doped thin region and so as to surround the exposed surface of the high resistivity region completely at said plane surface; and a heavily doped epitaxial semiconductor substrate of said first conductivity type epitaxially formed in contact with and underlying said heavily doped thin region and having a common plane surface with said plane surface of said high resistivity region, the exposed surface of said heavily doped thin region being completely surrounded with said heavily doped epitaxial substrate at said common plane surface, said epitaxial semiconductor substrate including crystallographical defects at least in the portion immediately adjacent to the interface between said heavily doped thin region and the epitaxial semiconductor substrate, the portion including crystallographical defects being separated from said high resistivity monocrystalline semiconductor region by said heavily doped thin region which is substantially free from crystallographical defects.

* * * * *